United States Patent
Schultz

(10) Patent No.: US 7,181,713 B2
(45) Date of Patent: Feb. 20, 2007

(54) STATIC TIMING AND RISK ANALYSIS TOOL

(75) Inventor: Richard T Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 270 days.

(21) Appl. No.: 11/028,403

(22) Filed: Jan. 3, 2005

(65) Prior Publication Data

US 2005/0114811 A1 May 26, 2005

Related U.S. Application Data

(63) Continuation-in-part of application No. 10/232,423, filed on Aug. 28, 2002, now Pat. No. 6,851,098.

(51) Int. Cl.
*G06F 17/50* (2006.01)
(52) U.S. Cl. ............................................. 716/6; 716/5
(58) Field of Classification Search .............. 716/6, 716/5
See application file for complete search history.

(56) References Cited

U.S. PATENT DOCUMENTS

| | | | | |
|---|---|---|---|---|
| 6,427,226 | B1* | 7/2002 | Mallick et al. | 716/10 |
| 6,442,741 | B1* | 8/2002 | Schultz | 716/6 |
| 6,658,635 | B1* | 12/2003 | Tanimoto | 716/6 |
| 6,851,098 | B2* | 2/2005 | Schultz | 716/6 |
| 7,032,191 | B2* | 4/2006 | Malekkhosravi et al. | 716/2 |
| 2005/0193353 | A1* | 9/2005 | Malekkhosravi et al. | 716/1 |
| 2005/0256921 | A1* | 11/2005 | Amekawa et al. | 708/800 |

* cited by examiner

*Primary Examiner*—Sun James Lin
(74) *Attorney, Agent, or Firm*—Krajec Patent Offices, LLC

(57) ABSTRACT

A system and method for evaluating multiple corner case static timing analyses. For each node within the analysis, the variability and margin of the node is used to create a risk factor that is used to identify nodes for further analysis. In some cases, a subset of nodes may be selected for static timing analysis with several additional corner cases. The variability of the node may be determined by the difference between the maximum and minimum value of the node between corner case analyses. The margin may be determined by the difference between the actual timing and the required timing. Various ratios using variability and margin may be used to identify those nodes on which to perform further analysis.

15 Claims, 5 Drawing Sheets

STATIC TIMING AND RISK ANALYSIS TOOL

CROSS REFERENCE TO RELATED APPLICATIONS

This application is a continuation-in-part of U.S. patent application Ser. No. 10/232,423, filed Aug. 28, 2002, now issued U.S. Pat. No. 6,851,098, the entire contents of which are specifically hereby incorporated by reference for all it teaches and discloses.

BACKGROUND OF THE INVENTION a. Field of the Invention

The present invention pertains generally to tools used to analyze integrated circuits during design and specifically to combining multiple static timing analyses in a useful manner.

b. Description of the Background

Integrated circuits (ICs) are extremely complex and contain an enormous number of components or cells. As the size of these components decreases, even more components can be manufactured on a single IC. The complexity of the ICs makes debugging an IC difficult and very labor intensive. Further, the sheer number of components, sometimes in the millions, may make pinpointing a problem area an enormous task.

Static timing analysis is a common method for finding problem areas of an IC during the design phase. The circuitry is simulated to determine if it meets the desired functionality. Generally, the static timing analysis can be run for several corner cases, such as high and low temperature, high and low voltages, and various processing conditions. As a check of the performance of the design prior to fabrication, many or all of the corner cases may be run and the design adjusted until all the corner cases pass.

Because of the complexities of some ICs, the run time to perform a static timing analysis is very long, sometimes requiring hours or days of computation time. In many cases, only a limited number of corner cases may be analyzed rather than fully evaluating every possible corner case. This leaves open the possibility that in some circumstances, a design that passes on the limited number of corner cases may actually fail in service.

It would therefore be advantageous to provide a system and method for identifying problem areas within a design prior to releasing the design to fabrication. It would be further advantageous to provide a system and method for identifying marginal problems with circuit timing, determining potential problem areas, and performing additional analysis on those areas as required.

SUMMARY OF THE INVENTION

The present invention provides a system and method for evaluating multiple corner case static timing analyses. For each node within the analysis, the variability and margin of the node is used to create a risk factor that is used to identify nodes for further analysis. In some cases, a subset of nodes may be selected for static timing analysis with several additional corner cases.

The variability of the node may be determined by the difference between the maximum and minimum value of the node between corner case analyses. The margin may be determined by the difference between the actual timing and the required timing. Various ratios using variability and margin may be used to identify those nodes on which to perform further analysis.

An embodiment may include a method of analyzing an integrated circuit comprising: creating a net list having a plurality of nodes that defines at least a portion of the integrated circuit; identifying a plurality of corner cases; performing a static timing analysis and generating a static timing analysis dataset for each of the plurality of corner cases; and for at least a portion of the plurality of nodes, calculating the variability of at least one timing parameter, calculating a margin for the at least one timing parameter, and determining a risk factor based upon the variability and the margin.

Another embodiment may include a method for analyzing an integrated circuit comprising: creating a net list having a plurality of nodes that defines at least a portion of the integrated circuit; identifying a plurality of corner cases; performing a static timing analysis and generating a plurality of static timing analysis datasets for each of the plurality of corner cases; and creating a multipass dataset based on determining the differences between the plurality of static timing analysis datasets from the static timing analysis by the method of: finding the maximum value of a specific node from the plurality of the static timing analysis datasets; finding the minimum value of the specific node from the plurality of the static timing analysis datasets; calculating a first difference between the maximum value and the minimum value; finding the required time for the specific node from the plurality of the static timing analysis datasets; finding the actual time for the specific node from the plurality of the static timing analysis datasets; calculating a second difference between the required time and the actual time; calculating a ratio between the first difference and the second difference; saving the ratio in the multipass dataset; and repeating the aforethe steps for each node in the datasets.

Yet another embodiment may include an integrated circuit designed in accordance with a process comprising: creating a net list having a plurality of nodes that defines at least a portion of the integrated circuit; identifying a plurality of corner cases; performing a static timing analysis and generating a plurality of static timing analysis dataset for each of the plurality of corner cases; creating a multipass dataset based on determining the differences between the plurality of static timing analysis datasets from the static timing analysis by the method of: finding the maximum value of a specific node from the plurality of the static timing analysis datasets; finding the minimum value of the specific node from the plurality of the static timing analysis datasets; calculating a first difference between the maximum value and the minimum value; finding the required time for the specific node from the plurality of the static timing analysis datasets; finding the actual time for the specific node from the plurality of the static timing analysis datasets; calculating a second difference between the required time and the actual time; calculating a ratio between the first difference and the second difference; saving the ratio in the multipass dataset; and repeating the aforethe steps for each node in the datasets; selecting a portion of the plurality of nodes by comparing the ratio to a predetermined value; and performing at least one static timing analysis on the portion of the plurality of nodes.

The advantages of the present invention are that marginal nodes in a design may be identified that may otherwise be overlooked. The marginal nodes may be further analyzed using additional static timing analysis corner cases to determine if a problem exists. Any problems uncovered during the design phase that can be corrected ensure a higher quality manufactured product and eliminates costly and frustrating failure analysis after manufacturing has begun.

DETAILED DESCRIPTION OF THE INVENTION

Figure 1:
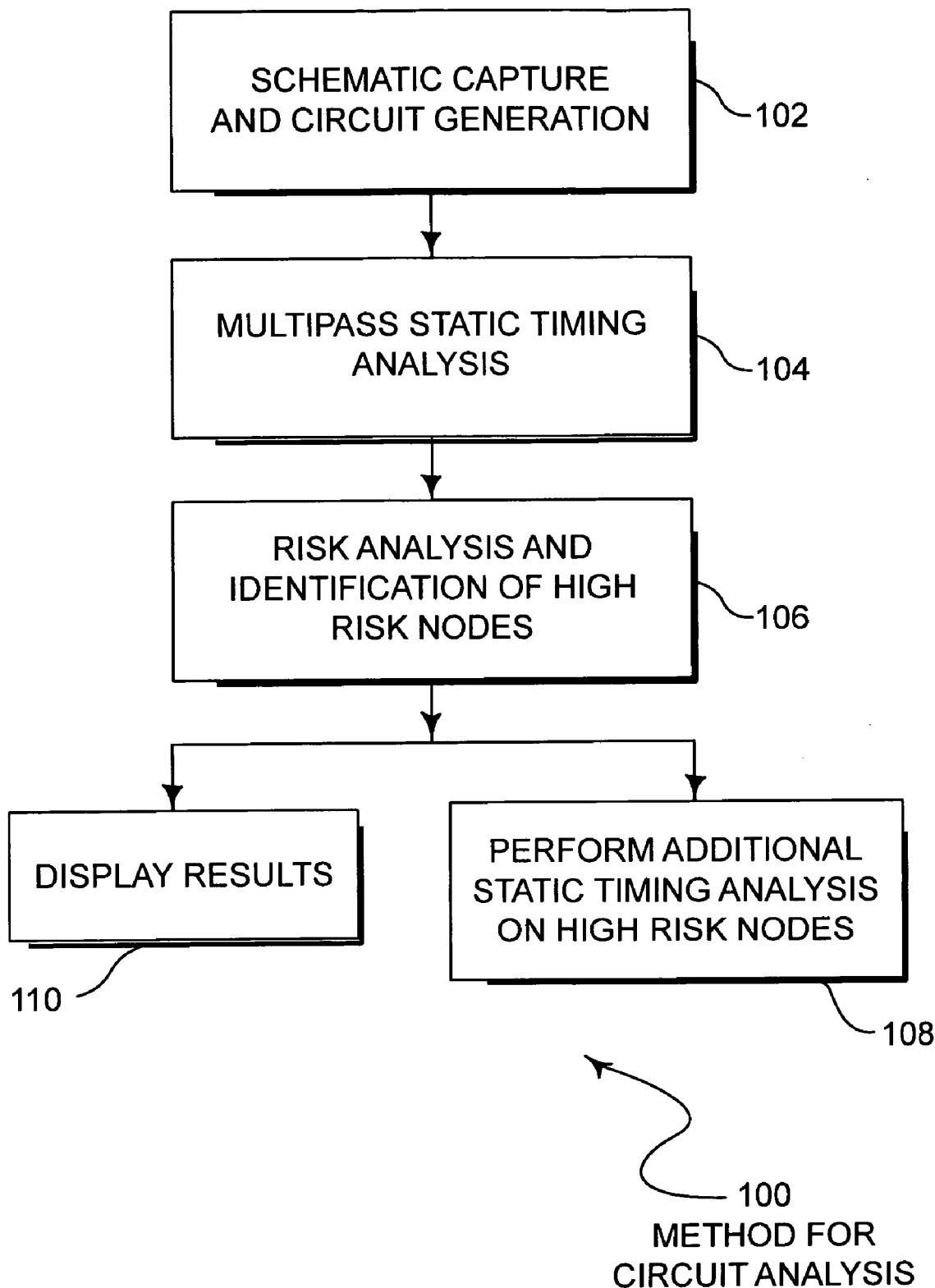
FIG. 1 is a flowchart illustration showing an embodiment of a method for circuit analysis.

Specific embodiments of the invention are described in detail below. The embodiments were selected to illustrate various features of the invention, but should not be considered to limit the invention to the embodiments described, as the invention is susceptible to various modifications and alternative forms. The invention is to cover all modifications, equivalents, and alternatives falling within the spirit and scope of the invention as defined by the claims. In general, the embodiments were selected to highlight specific inventive aspects or features of the invention.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The invention may be embodied as devices, systems, methods, and/or computer program products. Accordingly, some or all of the invention may be embodied in hardware and/or in software (including firmware, resident software, micro-code, state machines, gate arrays, etc.) Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. By way of example, and not limitation, computer readable media may comprise computer storage media and communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by an instruction execution system. Note that the computer-usable or computer-readable medium could be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

When the invention is embodied in the general context of computer-executable instructions, the embodiment may comprise program modules, executed by one or more systems, computers, or other devices. Generally, program modules include routines, programs, objects, components, data structures, etc. that perform particular tasks or implement particular abstract data types. Typically, the functionality of the program modules may be combined or distributed as desired in various embodiments.

Throughout this specification, the term "comprising" shall be synonymous with "including," "containing," or "characterized by," is inclusive or open-ended and does not exclude additional, unrecited elements or method steps. "Comprising" is a term of art which means that the named elements are essential, but other elements may be added and still form a construct within the scope of the statement. "Comprising" leaves open for the inclusion of unspecified ingredients even in major amounts.

FIG. 1 is a flowchart illustration of an embodiment 100 showing a method for analyzing a complex circuit, such as an integrated circuit (IC). The schematic capture and circuit generation is performed in block 102, followed by a multipass static timing analysis step in block 104. The results of the multipass static timing analysis of block 104 are used in the risk analysis and identification of high risk nodes of block 106. After risk analysis, additional static timing analyses may be performed on the high risk nodes in block 108 or the results may be displayed in block 110.

Embodiment 100 is a method of analyzing a complex integrated circuit or similar electrical circuit by performing static timing analysis using at least two corner cases, screen the nodes based on a risk factor, and then perform additional analyses on the high risk nodes. The complexity of a circuit may be such that performing one corner case analysis may require several hours or even days of computer time.

In embodiment 100, a group of high risk nodes are identified. The high risk nodes may have static timing analysis performed for many more corner cases than the entire design. This method allows a design team to rigorously check the circuit design in those areas that may be critical without having to perform many corner case analyses on the entire design, which may be prohibited by cost and time.

When a static timing analysis is run, values of several parameters may be: set up time, hold time, set up slack, hold slack, pulse width, clock skew, clock insertion delay, and clock arrival time. Throughout this specification, references to any particular static timing analysis parameter may also generally apply to any or all the parameters listed above, including any other parameter calculated during a static timing analysis.

The schematic capture and circuit generation in block 102 may be performed using conventional design tools well known in the art. The output of such tools may be used as an input to static timing analysis tools that are also well known in the art. Such tools may be incorporated into a single application or may be separate applications that communicate using a defined protocol. A typical design tool may create a node list that defines the connectivity of the circuitry.

The multipass static timing analysis in block 104 performs static timing analysis on several corner cases and may generate a multipass dataset that is an aggregate of several static timing analysis results. A corner case is a set of input values for static timing analysis that may include operating temperature of the circuit, input voltage, and various manufacturing parameters of an integrated circuit. In some cases, additional parameters may be used as inputs to the static timing analysis. For example, a corner case having high input voltage, low operating temperature, and the best manufacturing parameters may be compared to one with a low input voltage, high operating temperature, and the worst manufacturing parameters. Such results may show the extreme bounds of the circuit's performance.

In some systems, the manufacturing parameters may allow variation for separate layers of the integrated circuit. For example, an integrated circuit is manufactured using a long series of processes wherein each layer of components and traces are built up, etched away, filled with metal, etc. Each manufacturing step happens in series and is an independent event. Further, each step has a range of operating parameters that may affect the performance of the circuitry. For example, a middle layer of an integrated circuit may have traces that are both wide and thick, making the particular trace much more conductive than a similar trace on another layer that is narrow and thin.

In some situations, certain circuits may perform adequate when all the traces are at the maximum or minimum conductivity, but the circuit may have problems when one layer is at the maximum while another is at the minimum. Such problems may not be detected when running only the extreme corner cases, but may show up when other corner cases are run.

A typical static timing analysis result may include values such as set up, hold time, rise/fall times, and pulse width checks for each node of a circuit. A designer can analyze a circuit design by finding those nodes where the timing of the circuit fails any of these factors. If a problem exists, the designer may change the design until the design passes the analysis.

The risk analysis and identification of high risk nodes in block 106 develops a "risk factor" or weighting factor for each node based on the margin and variability of the analysis results. The risk factor may be a number that may be calculated several different ways but can be used to determine if a certain node is more sensitive to failure than another node.

After developing a set of high risk nodes in block 106, those nodes may be analyzed by performing additional static timing analyses using additional corner cases in block 108. The additional analysis may uncover situations where certain portions of the design are susceptible to problems. These areas may be further refined in the design stage before production begins, avoiding potential problems.

Additionally, the risk results may be displayed in block 110. In some situations, scatter plots are a particularly useful graphical tool to show the criticality of certain portions of the design.

The schematic capture and circuit generation in block 102 may be performed over a series of weeks or months. The multipass static timing analysis in block 104 may be performed at one time or may be performed on an on-going basis during the development of the circuit design. When a design is released to manufacturing, the multipass static analysis may be stored for use during any subsequent failure analysis of the manufactured part.

Figure 2:
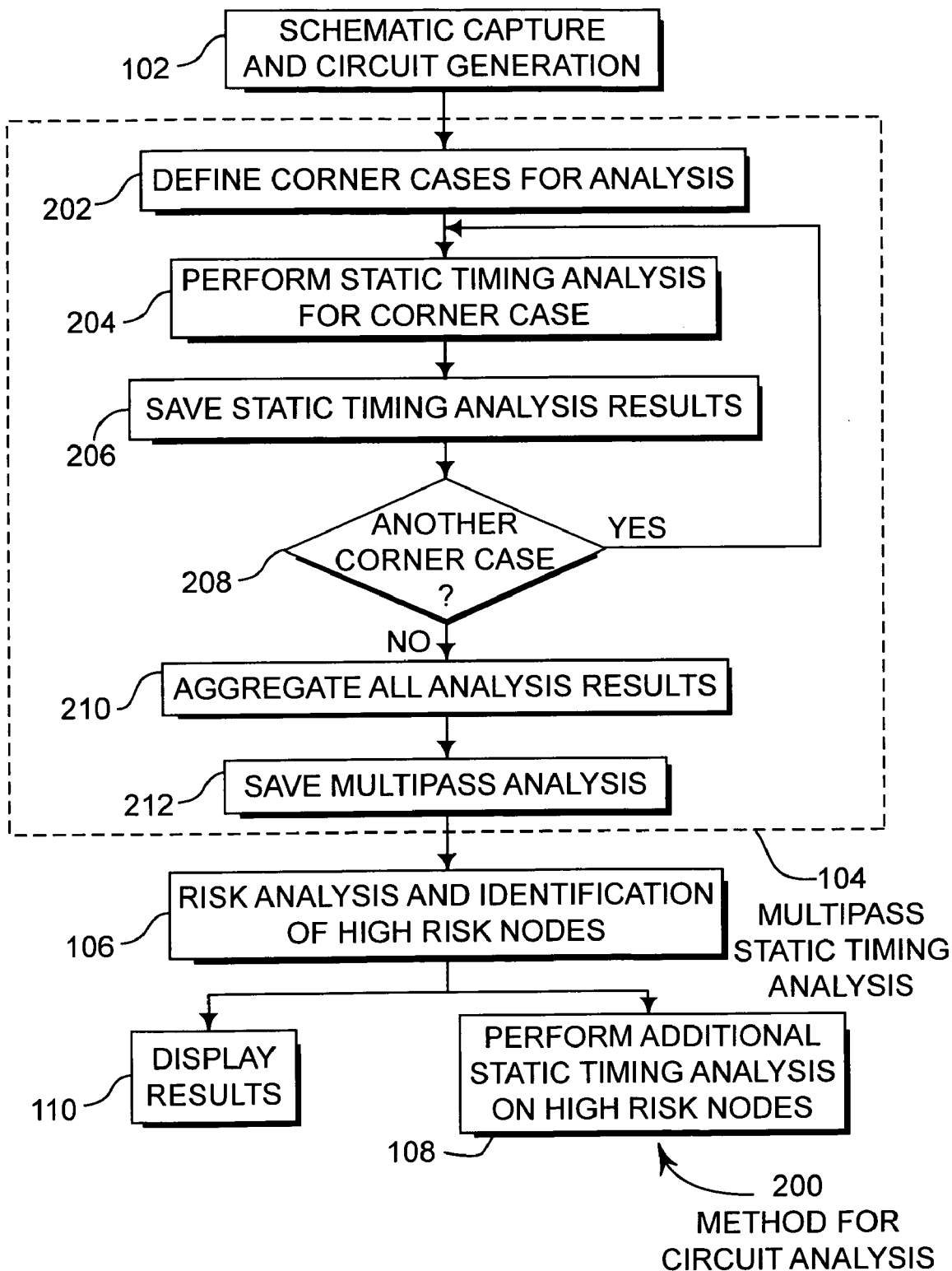
FIG. 2 is a flowchart illustration showing an embodiment of a method for circuit analysis, with details on multipass static timing analysis.

FIG. 2 is a flowchart illustration of an embodiment 200 of a method for analyzing a complex circuit, particularly detailing a multipass static timing analysis method. The circuit is designed using a schematic capture and circuit generation tool in block 102. Within the multipass static timing analysis block 104, the corner cases for the analysis are defined in block 202. The static timing analysis is performed using one of the corner cases in block 204, the results of which are saved in block 206. If another corner case needs to be run in block 208, the process continues with block 204. If no other corner cases need to be run in block 208, all of the analysis results are aggregated in block 210 and saved in block 212. The results of the multipass static timing analysis block 104 are processed for risk analysis in block 106. The risk analysis results may be used to perform additional static timing analysis in block 108 or may be displayed in block 110.

The multipass static timing analysis in block 104 performs multiple static timing analysis and aggregates the results. Typically, the worst case scenarios may be defined in the corner cases. For example, one corner case may be the most optimal manufacturing process limits, low temperature, and high input voltage. Another corner case may be the worst manufacturing process limits, high temperature, and low input voltage. In some embodiments, more than two corner cases may be used to develop a multipass dataset.

The results are aggregated in block 210. In some embodiments, the aggregation routine of block 210 may determine the minimum and maximum value for each result for each node analyzed. Additionally, some embodiments may include the raw data from each corner case analysis.

In some embodiments, the aggregated multipass dataset may contain summary data, such as maximum and minimum values, standard deviation, mean, and other summary statistics. In other embodiments, the aggregated multipass dataset may contain only the raw data values for each parameter of each node. Typically for each node, data for set up time, hold time, rise and fall times, and other parameters may be calculated.

The format for the multipass dataset may vary from embodiment to embodiment. In some cases, the multipass dataset may be a defined, organized data file stored on a computer. In other cases, the multipass dataset may be a stream of data that is used in sequence with the risk analysis of block 106. In such an example, the results from one parameter of one node may be aggregated from multiple corner case analyses and the aggregated result sent to block 106 in a piecemeal fashion. The multipass dataset may thus be created and analyzed in a parameter by parameter or node by node fashion without ever creating a complete and discrete multipass dataset before beginning the risk analysis of block 106.

Figure 3:
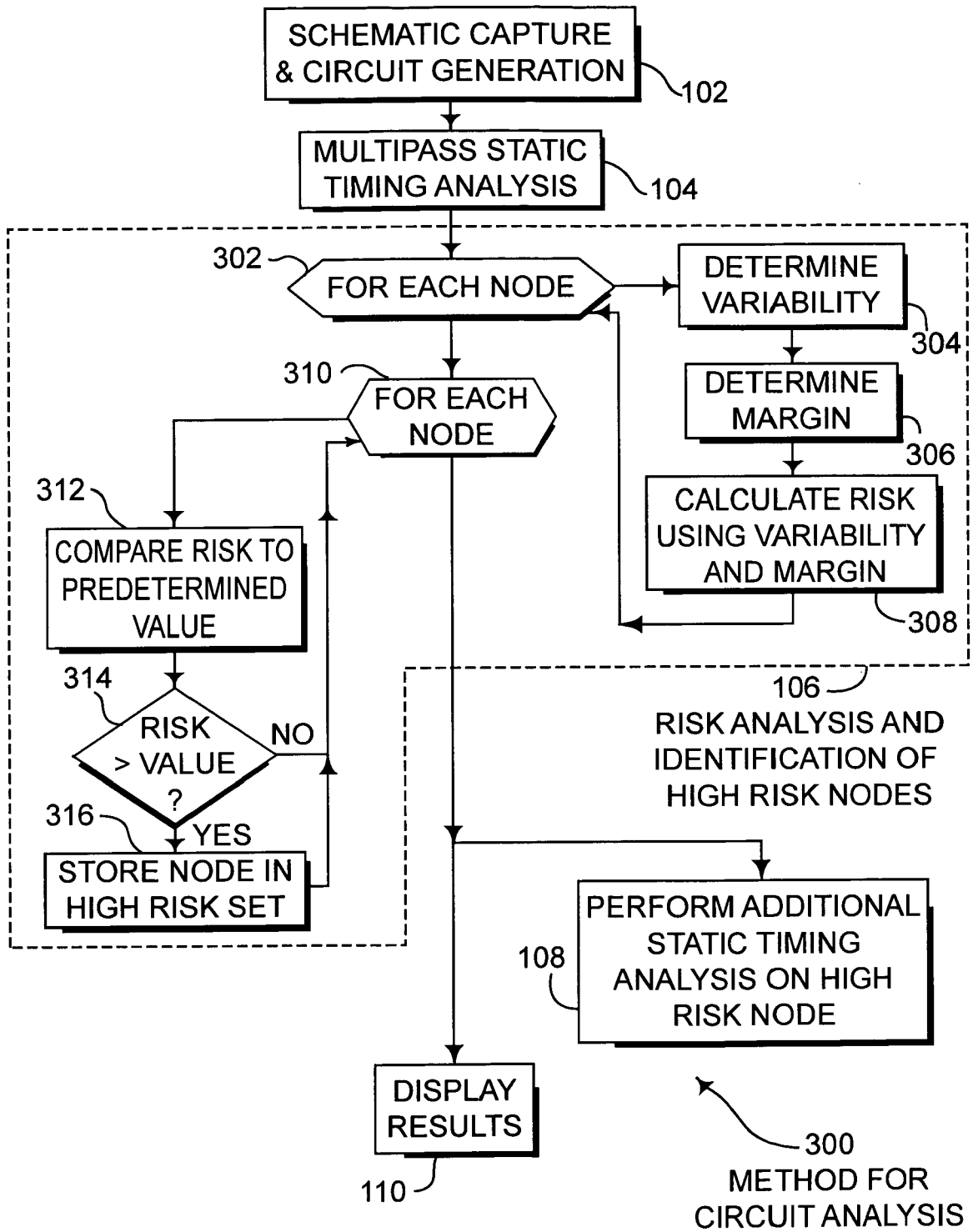
FIG. 3 is a flowchart illustration showing an embodiment of a method for circuit analysis, with details on risk analysis and identification of high risk nodes.

FIG. 3 is a flowchart illustration of an embodiment 300 showing a method for circuit analysis with a detailed illustration of the risk analysis and identification of high risk nodes. The circuit is created and defined in the schematic capture and circuit generation block 102. The multipass static timing analysis is performed in block 104. Within the risk analysis block 106, for each node in block 302, the variability of each parameter is determined in block 304, the margin is determined in block 306, and the risk is calculated in block 308. For each node in block 310, the risk is compared to a predetermined value in block 312. If the risk is greater than the value in block 314, the node is stored in a high risk set in block 316. After all the nodes are processed, additional static timing analysis may be performed in block 108 on the subset of nodes defined as high risk in 316 and the results may be displayed in block 110.

The embodiment 300 illustrates a method whereby a risk factor or weighting factor is calculated for each node or each parameter of each node. The risk factor may be a calculation using the variability and margin of each parameter. The node may be placed in a subset of the nodes for further processing if the risk factor is greater than some threshold value.

The variability of a parameter is determined in block 304. In some cases, the variability may be calculated by taking the difference between a maximum and minimum value for a certain parameter. In other cases, standard deviation may be calculated if three or more values are present. Different statistical measures of variability may be used in different embodiments depending on the circumstances.

The margin of a timing parameter within a node may be calculated by the difference between a calculated time and the minimum time for that parameter of that node. For example, if the calculated set up time were 250 ps and the minimum set up time for that node were 100 ps, the margin for set up time would be 150 ps. Margin may also be described as slack time. Margin may be calculated for each parameter.

The risk factor or weighting factor may be calculated in several different manners. The general concept is that the likelihood of failure may be greater when the variability is high and the margin is low. Conversely, if variability is low, especially when there is high margin, the risk of a problem with the parameter may be very low.

One method for calculating the risk may be to divide variability by the minimum margin. When there is a large variability and very small margin, the risk may be very high.

In other embodiments, the risk factor may be calculated by dividing the minimum margin by the absolute value of the difference between the maximum and minimum margins for a parameter.

In still other embodiments, the risk may be calculated by taking the square root of the ratio of the square of the difference divided by the square of the margin. In still other embodiments, the natural logarithm or base 10 logarithm of one or both of the margin or variability of a parameter may be used.

In yet other embodiments, the risk factor may be calculated by comparing the margin or variability of one parameter with another parameter, including the margin or variability of another parameter. For example, the difference in set up time may be divided by the minimum margin of set up time for that node.

The risk factor may be dimensionless number that can be calculated such that a larger value represents a greater likelihood of a problem or may be calculated such that a low number represents a greater likelihood of a problem.

Various formulas may be developed by those skilled in the art to calculate an appropriate risk factor. The formulas may be lengthy and complex or very simple, depending on the particular application.

After the risk factor is calculated for a node, high risk nodes may be selected for a subset of all of the nodes for further analysis. In some cases, the nodes may be selected by comparing the risk factor with a predetermined value. The actual predetermined value may depend on the particular application and the particular method for calculating risk.

In other embodiments, different criteria may be used to select nodes for further analysis. For example, a certain percent of the highest risk nodes may be selected. In such an embodiment, the top 1% of the riskiest nodes may be selected regardless if the risk factor exceeded some particular value. Other methods may be developed by those skilled in the arts to select particular nodes based on the risk factor.

Figure 4:
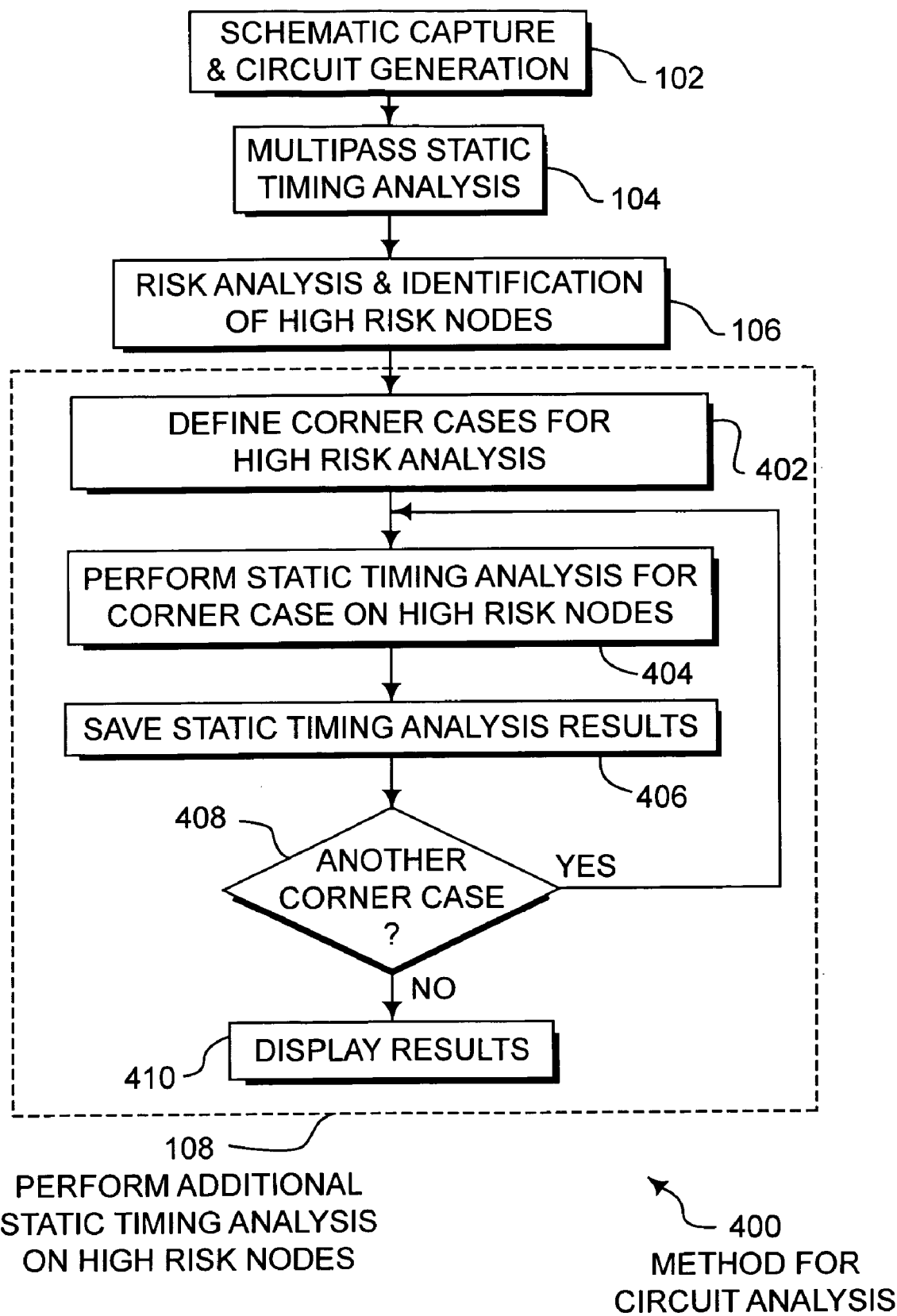
FIG. 4 is a flowchart illustration showing an embodiment of a method for circuit analysis, with details on performing additional static timing analysis on high risk nodes.

FIG. 4 is a flowchart illustration showing an embodiment 400 of a method for circuit analysis, emphasizing the method of performing additional static timing analysis on a subset of high risk nodes. The circuit is defined by schematic capture and circuit generation in block 102. Multipass static timing analysis is performed in block 104 and risk analysis and identification of high risk nodes is performed in block 106. Block 108 is the performance of additional static timing analysis on high risk nodes. In block 108, the corner cases are defined for the additional corner cases in block 402, and the static timing analysis is performed in block 404 and saved in block 406. If another corner case is needed in block 408, the process continues in block 404. If all the corner cases are completed in block 408, the results are displayed in block 410.

Embodiment 400 performs one or more static timing analyses on a subset of the entire set of nodes for a circuit, such as the subset defined in the risk analysis function of block 106 and embodiment 300. Because the additional static timing analyses are performed on a subset of the entire set of nodes, more analysis may be accomplished in a shorter period of time than if all the nodes were analyzed. Viewed in a different light, only those nodes that are likely to have problems are analyzed in great detail while those nodes that are likely to be very reliable are not over-analyzed.

The corner cases that may be run on the high risk nodes may be more detailed than the corner cases that are run on the entire set of nodes. For example, the entire set of nodes may have only the best case and worst case scenario corner cases. The high risk set may have corner cases applied that contain various combinations of high and low performance parameters that vary from layer to layer throughout the thickness of the integrated circuit. For example, the power distribution layers may be set to minimum parameters while the general circuit connection layers may be set to maximum parameters.

In some cases, the corner cases defined for the high risk nodes may be the result of monitoring various manufacturing parameters of a specific manufacturing line or factory. For example, if samples show that lower layers are consistently on the low side of the performance parameters, the additional corner cases may be devised that simulate such a scenario.

The results displayed in block 410 may be displayed in a schematic capture tool or any method by which the results may be useful. For example, a scatter graph, histogram, or other chart may be useful in some situations.

Figure 5:
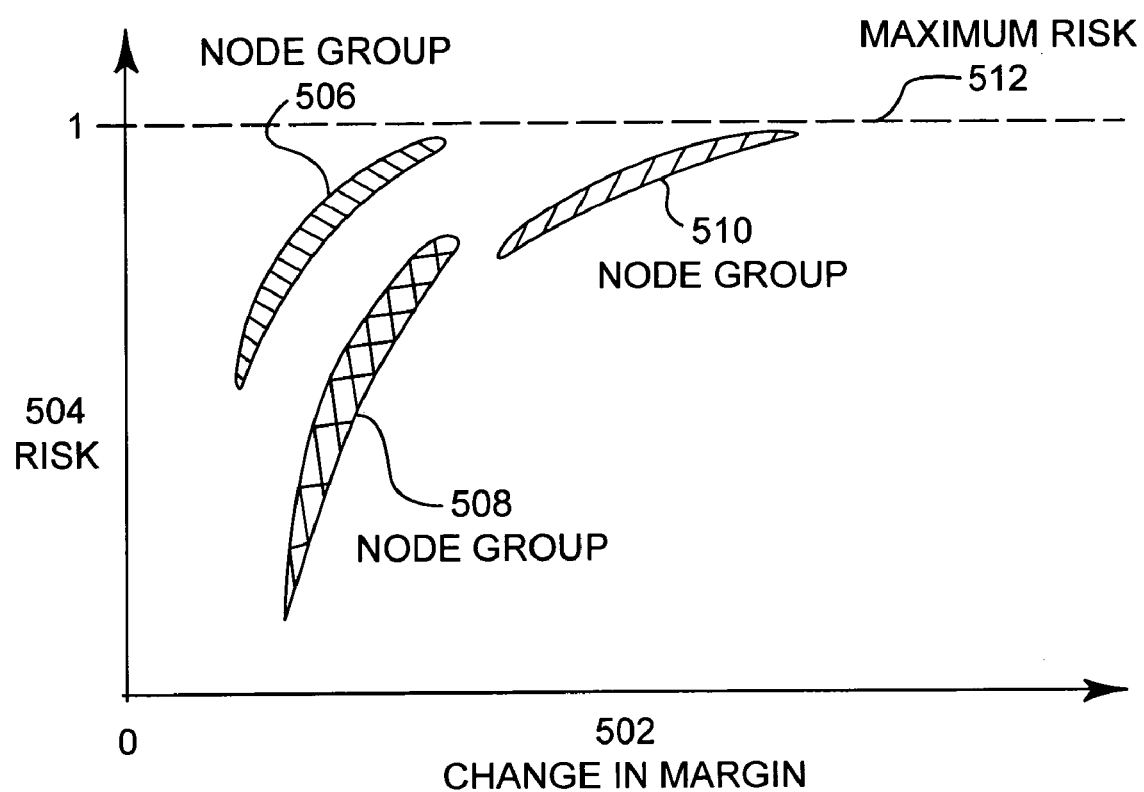
FIG. 5 is a pictorial representation of an embodiment of a scatter graph result from a risk analysis.

FIG. 5 is a scatter graph illustration 500 of risk results for a static timing analysis. The change in margin is displayed on the horizontal axis 502 verses the risk in the vertical axis 504. The node groups 506, 508, and 510 are point clusters for various subgroups of nodes in a circuit. The graph 500 is devised so that the maximum risk is defined by the dashed line 512.

For the graph 500, the formula for risk calculation may be $$\text{risk} = 1 - \frac{\min(\text{setup\_slack}_{corner1}, \text{setup\_slack}_{corner2})}{\text{abs}(\text{setup\_slack}_{corner1} - \text{setup\_slack}_{corner2})}$$

where risk is the risk factor, $\text{setup\_slack}_{corner1}$ is the margin of setup time for the first corner case and $\text{setup\_slack}_{corner2}$ is the margin of setup time for the second corner case. The min function determines the minimum value of those listed, and the abs function returns the absolute value of the operation. This particular risk function is designed so to that the maximum risk is a value of 1.

The graph 500 is a scatter graph where every node is shown as a point. When portions of the circuit are shown in different colors, patterns such as those shown in graph 500 emerge, where different portions of the circuitry tend to cluster together. For example, the node group 506 may be for one portion of the circuitry such as a certain branch of the clock circuit. Node group 508 may be a certain logic portion of the circuitry and node group 510 may be from another functional area of the circuitry.

The graph 500 shows that the circuitry in node group 508 has a small amount of margin change and a minimum risk. This circuitry may be very well designed, may be underutilized, or have some other characteristic. The node group 510 suffers from high changes in margin, meaning that the performance of node group 510 may change drastically over various implementations. Further, node group 510 as a group has high risk. Similarly, node group 506 has a high risk, but does not have a large change in margin.

From analyzing the graph 500, a designer may determine that the circuitry of node groups 506 and 510 are worth additional design time to optimize and improve, while node group 508 is adequate without further design time.

Embodiment 500 is but one useful manner in which risk analysis may be used during the design cycle. Histograms, scatter graphs, XY plots, and any other graphical representation may be useful for viewing the risk analysis data to isolate certain areas for further development.

Additionally, risk analysis data may be used to qualify a design. For example, a design signoff criteria may require that every node have a risk factor below a certain value before the design is ready for fabrication and testing. In some cases, such a factor may be a customer or military specification that is enforced by a specific commercial or military customer.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of analyzing an integrated circuit comprising:
   creating a net list having a plurality of nodes that defines at least a portion of said integrated circuit;
   identifying a plurality of corner cases;
   performing a static timing analysis and generating a static timing analysis dataset for each of said plurality of corner cases; and
   for at least a portion of said plurality of nodes, calculating a variability of at least one timing parameter, calculating a margin for said at least one timing parameter, and determining a risk factor based upon said variability and said margin.

2. The method of claim 1 further comprising:
   selecting a subset of said plurality of nodes based on said risk factor;
   identifying at least one additional corner case; and
   performing a static timing analysis using said at least one additional corner case on said subset of said plurality of nodes.

3. The method of claim 2 wherein said selecting a subset of said plurality of nodes comprises comparing said risk factor against a predetermined value.

4. The method of claim 1 wherein said variability comprises determining a difference between results of a first of said static timing analysis dataset and a second of said static timing analysis dataset.

5. The method of claim 1 wherein said margin comprises determining a difference between a required timing and an actual timing for each of said portion of said plurality of nodes.

6. The method of claim 1 wherein said risk factor comprises dividing said variability by said margin.

7. The method of claim 1 wherein said at least one timing parameter comprises at least one from a group composed of: set up time, hold time, set up slack, hold slack, pulse width, clock skew, clock insertion delay, and clock arrival time.

8. The method of claim 1 further comprising displaying said risk factor.

9. The method of claim 8 wherein said displaying said risk factor comprises a graph having said risk factor on one axis.

10. A method for analyzing an integrated circuit comprising:
    creating a net list having a plurality of nodes that defines at least a portion of said integrated circuit;
    identifying a plurality of corner cases;
    performing a static timing analysis and generating a plurality of static timing analysis datasets for each of said plurality of corner cases; and
    creating a multipass dataset based on determining differences between said plurality of static timing analysis datasets from said static timing analysis by the method comprising steps of:
      finding a maximum value of a specific node from said plurality of said static timing analysis datasets;
      finding a minimum value of said specific node from said plurality of said static timing analysis datasets;
      calculating a first difference between said maximum value and said minimum value;

finding a required time for said specific node from said plurality of said static timing analysis datasets;

finding an actual time for said specific node from said plurality of said static timing analysis datasets;

calculating a second difference between said required time and said actual time;

calculating a ratio between said first difference and said second difference;

saving said ratio in said multipass dataset;

and repeating the aforesaid steps for each node in said plurality of static timing analysis datasets.

11. The method of claim 10 further comprising:

selecting a portion of said plurality of nodes by comparing said ratio to a predetermined value; and performing at least one static timing analysis on said portion of said plurality of nodes.

12. The method of claim 11 wherein said at least one static timing analysis is performed using a corner case that is not within said plurality of corner cases.

13. The method of claim 10 further comprising displaying said multipass dataset.

14. A computer-readable medium having computer-executable instructions for performing the steps recited in claim 10.

15. An integrated circuit designed in accordance with a process comprising:

creating a net list having a plurality of nodes that defines at least a portion of said integrated circuit;

identifying a plurality of corner cases;

performing a static timing analysis and generating a plurality of static timing analysis datasets for each of said plurality of corner cases;

creating a multipass dataset based on determining differences between said plurality of static timing analysis datasets from said static timing analysis by a method comprising steps of:

finding a maximum value of a specific node from said plurality of said static timing analysis datasets;

finding a minimum value of said specific node from said plurality of said static timing analysis datasets;

calculating a first difference between said maximum value and said minimum value;

finding a required time for said specific node from said plurality of said static timing analysis datasets;

finding an actual time for said specific node from said plurality of said static timing analysis datasets;

calculating a second difference between said required time and said actual time;

calculating a ratio between said first difference and said second difference;

saving said ratio in said multipass dataset; and repeating the aforesaid steps for each node in said datasets plurality of static timing analysis;

selecting a portion of said plurality of nodes by comparing said ratio to a predetermined value; and performing at least one static timing analysis on said portion of said plurality of nodes.

* * * * *